United States Patent
Jou et al.

(10) Patent No.: US 9,559,635 B2
(45) Date of Patent: *Jan. 31, 2017

(54) METHOD AND APPARATUS OF SYNCHRONIZING OSCILLATORS

(71) Applicant: Taiwan Semiconductor Manufacturing Company, Ltd., Hsin-Chu (TW)

(72) Inventors: Chewn-Pu Jou, Hsin-Chu (TW); Huan-Neng Chen, Taichung (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/942,425

(22) Filed: Nov. 16, 2015

(65) Prior Publication Data

US 2016/0072436 A1    Mar. 10, 2016

Related U.S. Application Data

(63) Continuation of application No. 14/075,021, filed on Nov. 8, 2013, now Pat. No. 9,191,014.

(51) Int. Cl.
*H03K 3/03* (2006.01)
*H03B 5/12* (2006.01)
(Continued)

(52) U.S. Cl.
CPC .............. *H03B 5/1212* (2013.01); *H03B 1/00* (2013.01); *H03B 5/1228* (2013.01);
(Continued)

(58) Field of Classification Search
CPC ............ H03L 7/24; H03L 7/00; H03B 5/1212; H03B 27/00; H03B 1/00; H03B 5/1228; H03B 5/1296; H03B 5/1243; H03B 5/1265; H03B 5/1253; H03B 5/1237
(Continued)

(56) References Cited

U.S. PATENT DOCUMENTS

| 5,357,217 A | 10/1994 | Marchesi et al. |
| 6,639,481 B1 | 10/2003 | Ravi et al. |

(Continued)

FOREIGN PATENT DOCUMENTS

TW    I406306 B    8/2013

*Primary Examiner* — Arnold Kinkead
(74) *Attorney, Agent, or Firm* — Slater Matsil, LLP (57) ABSTRACT

A circuit includes a first oscillator and a second oscillator. The first oscillator includes an inductive device, a capacitive device, and an active feedback device configured to output a first output signal having a predetermined frequency according to electrical characteristics of the inductive device of the first oscillator and electrical characteristics of the capacitive device of the first oscillator. The second oscillator includes an inductive device, a capacitive device, and an active feedback device configured to output a second output signal having the predetermined frequency according to electrical characteristics of the inductive device of the second oscillator and electrical characteristics of the capacitive device of the second oscillator. The inductive device of the first oscillator and the inductive device of the second oscillator are magnetically coupled.

20 Claims, 6 Drawing Sheets

(51) Int. Cl.
  *H03L 7/00* (2006.01)
  *H03B 27/00* (2006.01)
  *H03L 7/24* (2006.01)
  *H03B 1/00* (2006.01)

(52) U.S. Cl.
  CPC ......... *H03B 5/1237* (2013.01); *H03B 5/1243* (2013.01); *H03B 5/1253* (2013.01); *H03B 5/1265* (2013.01); *H03B 5/1296* (2013.01); *H03B 27/00* (2013.01); *H03L 7/00* (2013.01); *H03L 7/24* (2013.01)

(58) Field of Classification Search
  USPC .... 331/2, 46, 55, 167, 117 FE, 117 R, 36 L; 336/199, 200; 370/277
  See application file for complete search history.

(56) References Cited

U.S. PATENT DOCUMENTS

| | | | |
|---|---|---|---|
| 6,891,444 B2 | 5/2005 | Jacobsson et al. | |
| 7,173,498 B2 | 2/2007 | Ramaswamy et al. | |
| 7,423,495 B2 | 9/2008 | Bevilacqua et al. | |
| 7,551,038 B2 | 6/2009 | Jang et al. | |
| 7,633,352 B2 | 12/2009 | El Rai | |
| 7,847,650 B2 | 12/2010 | Yao et al. | |
| 8,058,934 B2 | 11/2011 | Rangarajan et al. | |
| 8,138,845 B1 * | 3/2012 | Zhang | H03B 5/1228 331/117 FE |
| 8,174,288 B2 | 5/2012 | Dennard et al. | |
| 8,258,907 B2 | 9/2012 | Hansen | |
| 8,593,232 B2 | 11/2013 | Chataigner | |
| 8,638,175 B2 | 1/2014 | Dubey | |
| 9,018,987 B1 | 4/2015 | Lahiri | |
| 2002/0003452 A1 | 1/2002 | Mizuno et al. | |
| 2004/0227608 A1 | 11/2004 | Nakatani et al. | |
| 2006/0001496 A1 | 1/2006 | Abrosimov et al. | |
| 2008/0252387 A1 | 10/2008 | Higashi | |
| 2009/0261911 A1 | 10/2009 | Watanabe et al. | |
| 2009/0289727 A1 | 11/2009 | El Rai | |
| 2010/0176889 A1 | 7/2010 | Nix et al. | |
| 2010/0225407 A1 | 9/2010 | Goyal et al. | |
| 2010/0295625 A1 * | 11/2010 | Tanabe | H01F 21/12 331/117 FE |
| 2011/0050354 A1 | 3/2011 | Hirashiki et al. | |
| 2011/0076979 A1 | 3/2011 | Wu et al. | |
| 2011/0102093 A1 | 5/2011 | El Rai et al. | |
| 2011/0148536 A1 | 6/2011 | Italia et al. | |
| 2012/0039366 A1 * | 2/2012 | Wood | G01S 7/03 375/219 |
| 2012/0286879 A1 | 11/2012 | Nylen | |
| 2013/0194047 A1 | 8/2013 | Tomita et al. | |
| 2014/0218120 A1 * | 8/2014 | Hekmat | H03B 5/1228 331/45 |

* cited by examiner

METHOD AND APPARATUS OF SYNCHRONIZING OSCILLATORS

PRIORITY CLAIM AND CROSS-REFERENCE

This application is a continuation of U.S. application Ser. No. 14/075,021, filed on Nov. 8, 2013, entitled "METHOD AND APPARATUS OF SYNCHRONIZING OSCILLATORS," which application is hereby incorporated herein by reference.

BACKGROUND

In an integrated circuit, a clock tree is generally used for distributing a common clock signal to various components in order to synchronize the operation thereof. Differences in the arrival time of the clock signals at two or more clocked components of the integrated circuit can result in errors in the operation of the integrated circuit. In some applications, the clock tree for the distribution of the common clock signal includes structures such as H-tree meshes or balanced buffer trees. In many cases, mismatch of the arrival of the distributed clock signals is minimized at the cost of sufficient driving current for distributing the common clock signal along the clock tree. With the increase of the frequency of the clock signal, power consumption for driving the clock tree increases. Also, clock buffers at various stages of the clock trees usually draw huge currents from a power supply grid, and thus affect the performance of nearby components by causing voltage drops of the supply voltage. In some applications, clock trees use 20% to 40% of total power consumption of the integrated circuits.

BRIEF DESCRIPTION OF THE DRAWINGS

One or more embodiments are illustrated by way of example, and not by limitation, in the figures of the accompanying drawings, wherein elements having the same reference numeral designations represent like elements throughout.

DETAILED DESCRIPTION

It is understood that the following disclosure provides one or more different embodiments, or examples, for implementing different features of the disclosure. Specific examples of components and arrangements are described below to simplify the present disclosure. These are, of course, examples and are not intended to be limiting. In accordance with the standard practice in the industry, various features in the drawings are not drawn to scale and are used for illustration purposes only.

In some embodiments, two or more oscillators configured to generate output oscillating signals having a predetermined frequency, instead of using a clock tree, is utilized to distribute a clock signals to various clocked components in an integrated circuit. Furthermore, one or more synchronization mechanisms are implemented to minimize frequency or phase differences among the oscillating signals generated by the two or more oscillators. In some embodiments, the one or more synchronization mechanisms include magnetic coupling, master-slave fine-tuning, and pulse injection.

Figure 1:
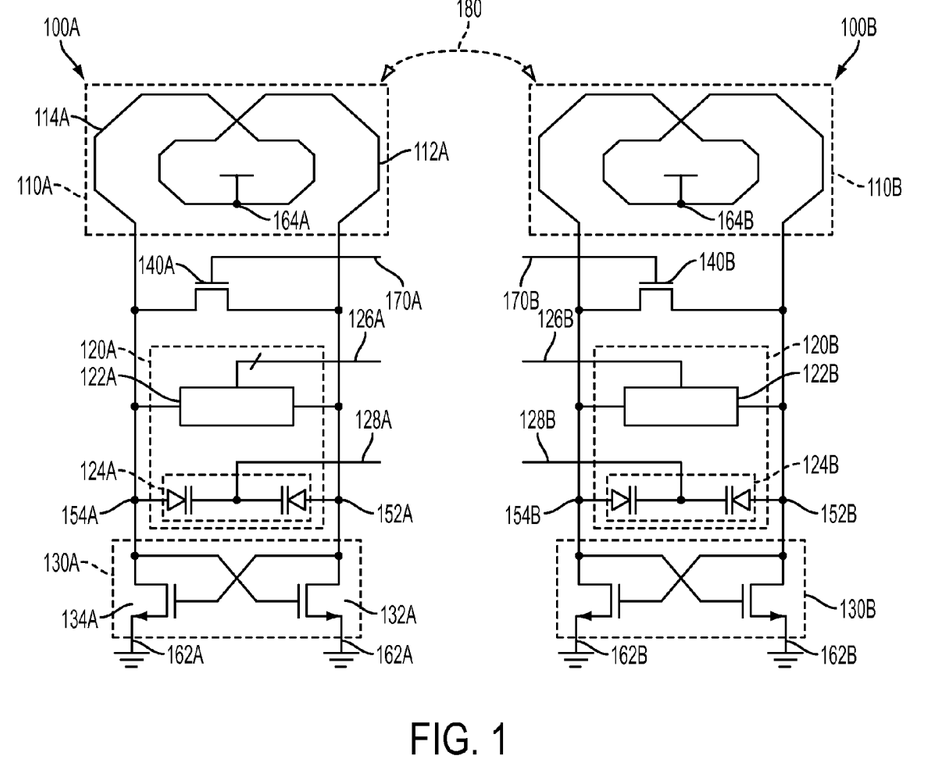
FIG. 1 is a schematic diagram of two oscillators in accordance with one or more embodiments.

FIG. 1 is a schematic diagram of two oscillators 100A and 100B in accordance with one or more embodiments. In some embodiments, oscillators 100A and 100B are configured to generate oscillating signals having a predetermined frequency. In some embodiments, frequencies of oscillating signals from oscillators 100A and 100B are approximately the same but not exactly equal to the predetermined frequency. Also, in some embodiments, phases of oscillating signals from oscillators 100A and 100B are not exactly synchronized. In some embodiments, synchronizing oscillators 100A and 100B refers to minimizing the frequency or phase differences between the oscillating signals from oscillators 100A and 100B. Although only two oscillators 100A and 100B are illustrated in conjunction with FIG. 1, the synchronization mechanisms illustrated in this disclosure are applicable to two or more similarly configured oscillators of a same integrated circuit.

Oscillator 100A includes an inductive device 110A, a capacitive device 120A, an active feedback device 130A, a switch device 140A, an output node 152A, and a complementary output node 154A. Inductive device 110A, capacitive device 120A, active feedback device 130A, and switch device 140A are coupled between output node 152A and complementary output node 154A.

Active feedback device 130A includes two N-type transistors 132A and 134A. Source terminals of transistors 132A and 134A are coupled with ground reference node 162A. A drain terminal of transistor 132A is coupled with node 152A and a gate terminal of transistor 134A, and a drain terminal of transistor 134A is coupled with node 154A and a gate terminal of transistor 132A. Active feedback device 130A is configured to output a first output oscillating signal at node 152A and a first complementary output oscillating signal at node 154A. The first output oscillating signal and the first complementary output oscillating signal have the predetermined frequency determined according to electrical characteristics of inductive device 110A and electrical characteristics of the capacitive device 120A. In some embodiments, if inductive device 110A has a inductance of $L_{TOTAL}$ and capacitive device 120A has a capacitance of $C_{TOTAL}$, the predetermined frequency $F_{OSC}$ (in Hz) is determinable according to the following equation:

$$F_{OSC} = \frac{1}{2\pi\sqrt{L_{TOTAL}C_{TOTAL}}}$$

In some applications, oscillators having configurations similar to oscillator 100A are also known as "LC tank oscillators." In some embodiments, transistors 132A and 134A are P-type transistors. In some embodiments, other types of active feedback devices are also usable as active feedback device 130A.

Inductive device 110A includes inductor 112A and inductor 114A integratedly formed as a conductive coil. Inductor 112A is coupled between node 152A and a supply reference node 164A, and inductor 114A is coupled between node 154A and supply reference node 164A.

Capacitive device 120A includes a coarse-tuning capacitor 122A and a fine-tuning capacitor 124A. In some embodiments, capacitance of coarse-tuning capacitor 122A is set according to a set of digital signals from bus 126A. In some embodiments, a coarse-tuning capacitor 122A is replaced by a set of hard-wired capacitors, and thus capacitance of coarse-tuning capacitor 122A is fixed and bus 126A is thus omitted. In some embodiments, capacitance of fine-tuning capacitor 124A is set according to an analog signal from path 128A. In some embodiments, a resonant frequency of oscillator 100A is adjustable by controlling coarse-tuning capacitor 122A or fine-tuning capacitor 124A.

Switch device 140A is configured to set signals at nodes 152A and 154A at corresponding predetermined voltage levels when switch device 140A is turned on. For example, when switch device 140A is turned on, node 152A and 154A are electrically coupled together. Under this circumstance, transistors 132A and 134A and inductors 112A and 114A function as a voltage divider, and signals at node 152A and 154A are set at a voltage level determinable according to impedance of transistors 132A and 134A and inductors 112A and 114A. In some embodiments, when switch device 140A is turned on, signals at node 152A and 154A are set at about the middle of voltage levels of the supply reference node 164A and ground reference node 162A.

Switches device 140A is controlled by a signal on path 170A. In some embodiments, the control signal on path 170A is a pulse signal used to force the crossing-over of oscillating signals at node 152A and 154A. Therefore, in the present application, switch device 140A is also referred to as a reset device or a pulse-injection device. In some embodiments, switch device 140A is a transistor. In some embodiments, switch device 140A is a P-type transistor, an N-type transistor, or a transmission gate. In some embodiments, switch device 140A is omitted.

Oscillator 100B includes an inductive device 110B, a capacitive device 120B, an active feedback device 130B, a switch device 140B, an output node 152B, and a complementary output node 154B. Oscillator 100B and Oscillator 100A have substantially the same configuration. Components of oscillator 100B similar to those of oscillator 100A are given similar reference numbers, except the corresponding suffixes are changed from 'A' to 'B'. Features and functions of oscillator 100B are substantially similar to those advanced above with regard to oscillator 100A, and detailed description regarding oscillator 100B is thus not repeated.

In some embodiments, oscillator 100A and oscillator 100B are on a same substrate, different substrates on a same package substrate, different substrates of a stack of substrates, or different substrates of a stack of dies. In some embodiments, a power distribution network is implemented to cause supply reference nodes 164A and 164B to have substantially a same supply voltage level, and to cause ground reference nodes 162A and 162B to have substantially a same ground reference level. In some embodiments, digital signals on buses 126A and 126B have the same logic values.

In some embodiments, signals on path 170A and path 170B are provided by a signal distribution network based on a common signal. In some embodiments, signals on path 170A and path 170B are synchronized signals. In some embodiments, signals on path 170A and path 170B are pulse signals. In some embodiments, the predetermined frequency of output oscillating signals of oscillators 100A and 100B is an integer multiple of a frequency of signals on path 170A and path 170B.

Furthermore, inductive device 110A of oscillator 100A and inductive device 110B of oscillator 100B are magnetically coupled (as depicted by dotted arrow 180). Magnetic coupling between inductive device 110A and inductive device 110B refers to that magnetic flux generated by operating inductive device 110A affects operation of inductive device 110B, and vice versa. Similar to the location where oscillators 100A and 100B are disposed, in some embodiments, inductive device 110A and inductive device 110B are on a same substrate, different substrates on a same package substrate, different substrates of a stack of substrates, or different substrates of a stack of dies. Inductive device 110A and inductive device 110B are configured to attenuate out-of-phase components and enhance in-phase component of oscillating signals at node 152A of oscillator 100A and node 152B of oscillator 100B. As a result, after oscillator 100A and oscillator 100B are enabled, output oscillating signals at nodes 152A and 152B are eventually stabilized to be in-phase oscillating signals. In other words, inductive device 110A and inductive device 110B are configured to synchronize oscillating signals generated by oscillator 100A and oscillator 100B.

In some embodiments, inductive device 110A of oscillator 100A and inductive device 110B of oscillator 100B have a distance equal to or less than a predetermined distance in order to cause mutual-inductance sufficient to synchronize oscillator 100A and oscillator 100B within a predetermined period of time. In some embodiments, the predetermined distance is one half of a wavelength of an electromagnetic wave having the predetermined frequency of oscillating signals. In some embodiments, the predetermined frequency of output oscillating signals ranges from 100 MHz to 20 GHz.

Figure 2A:
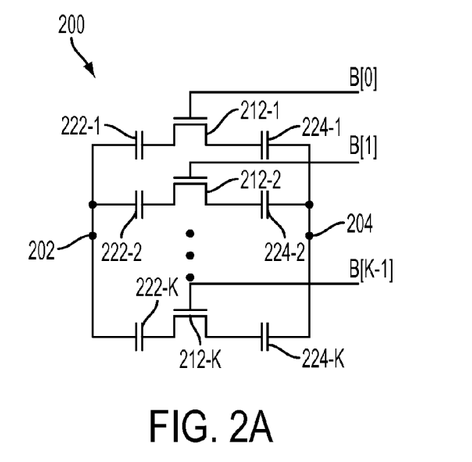
FIG. 2A is a schematic diagram of a capacitor array usable in one or both of the oscillators in FIG. 1 in accordance with one or more embodiments.

FIG. 2A is a schematic diagram of a capacitor array 200 usable as coarse-tuning capacitor 122A or coarse-tuning capacitor 122B in accordance with one or more embodiments. Capacitor array 200 includes a first node 202, a second node 204, K transistors 212-1 to 212-K, and 2K capacitors 222-1 to 222-K and 224-1 to 224-K, where K is a positive integer. First node 202 and second node 204 are usable to be connected with the corresponding node 152A or node 154A, or to be connected with the corresponding node 152B or node 154B. Capacitors 222-1 to 222-K are coupled to first node 202, capacitors 224-1 to 224-K are coupled to second node 204, and transistors 212-1 to 212-K are coupled between corresponding pairs of capacitors 222-1 to 222-K and 224-1 to 224-K. Transistors 212-1 to 212-K function as switches and controlled by control signals B[0], B[1], to B[K−1].

In some embodiments, transistors 212-1 to 212-K are P-type transistors or N-type transistors. In some embodiments, transistors 212-1 to 212-K are replaced by transmission gates or other types of switches. In some embodiments, capacitors 222-1 to 222-K and 224-1 to 224-K are metal-oxide-metal capacitors or metal-insulator-metal capacitors.

In some embodiments, total capacitance of each path, including one of transistors 212-1 to 212-K, a corresponding capacitor of capacitors 222-1 to 222-K, and a corresponding capacitor of capacitors 224-1 to 224-K, has a same value. Under these circumstances, control signals B[0:K−1] are coded in a unary coding format. In some embodiments, total capacitance of each path as defined above corresponds to one of $2^0, 2^1, \ldots 2^{K-1}$ times of a predetermined unit capacitance value. Under these alternative circumstances, control signals B[0:K−1] are coded in a binary coding format.

Figure 2B:
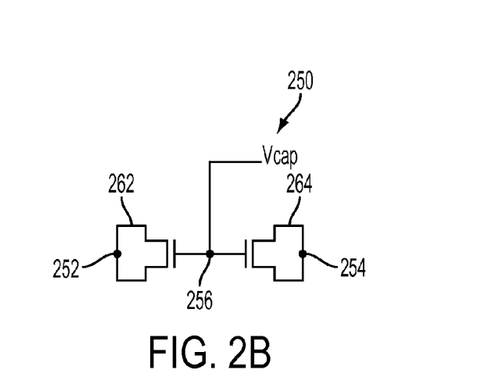
FIG. 2B is a schematic diagram of a varactor usable in one or both of the oscillators in FIG. 1 in accordance with one or more embodiments.

FIG. 2B is a schematic diagram of a varactor 250 usable as fine-tuning capacitor 124A or fine-tuning capacitor 124B in FIG. 1 in accordance with one or more embodiments. Varactor 250 includes a first node 252, a second node 254, a control node 256, and transistors 262 and 264. First node 252 and second node 254 are usable to be coupled with a corresponding node 152A or node 154A, or to be coupled with a corresponding node 152B or node 154B. Transistor 262 has a drain terminal and a source terminal coupled together with first node 252. Transistor 262 has a gate terminal coupled to the control node 256. Transistor 264 has a drain terminal and a source terminal coupled together with second node 254. Transistor 264 has a gate terminal coupled to the control node 256. Control node 256 is configured to receive an analog control signal $V_{CAP}$, such as a control signal on path 128A or 128B. A total capacitance between nodes 252 and 254 is adjustable responsive to a voltage level of control signal $V_{CAP}$. In some embodiments, transistors 262 and 264 are P-type transistors or N-type transistors.

In FIG. 1, only two oscillators 100A and 100B are depicted. However, in some embodiments, there are more than two oscillators for generating clocks in an integrated circuit. Also, the inductive device 110A or 110B of an oscillator 100A or 100B is capable of magnetically coupled with more than two inductive devices of two or more oscillators.

Figure 3:
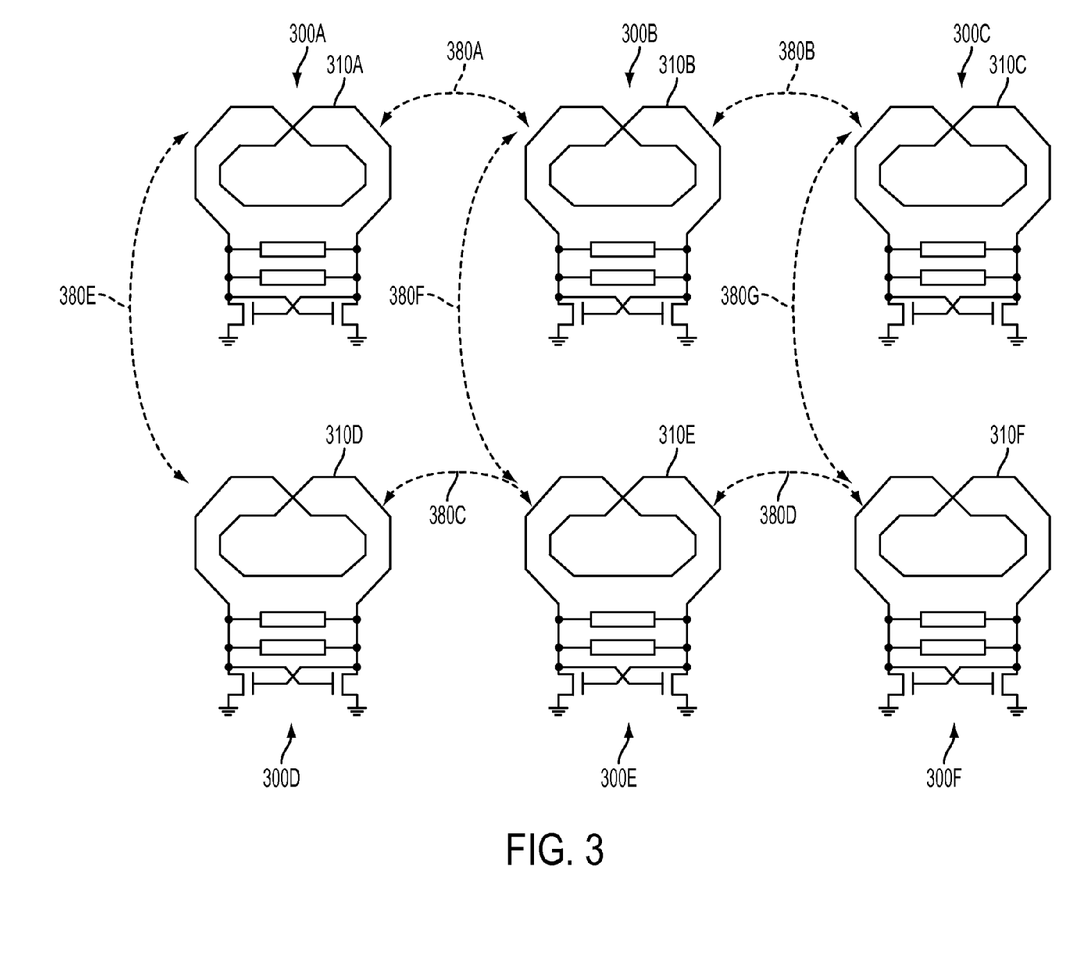
FIG. 3 is a schematic diagram of six oscillators in accordance with one or more embodiments.

For example, FIG. 3 is a schematic diagram of six oscillators 300A to 300F in accordance with one or more embodiments. Oscillators 300A to 300F have a configuration similar to oscillator 100A described above. Among other things, oscillators 300A to 300F have corresponding inductive devices 310A to 310F. Other details of oscillators 300A to 300F are omitted.

As depicted in FIG. 3, inductive devices 310A and 310B are magnetically coupled (dotted arrow 380A); inductive devices 310B and 310C are magnetically coupled (dotted arrow 380B); inductive devices 310D and 310E are magnetically coupled (dotted arrow 380C); inductive devices 310E and 310F are magnetically coupled (dotted arrow 380D); inductive devices 310A and 310D are magnetically coupled (dotted arrow 380E); inductive devices 310B and 310E are magnetically coupled (dotted arrow 380F); and inductive devices 310C and 310F are magnetically coupled (dotted arrow 380G). In this embodiment, mutual-inductive coupling 380A to 380G are configured to cause oscillators 300A to 300F to generate oscillating signals having approximately a same predetermined frequency and approximately the same phase.

In some embodiments, inductive devices 310A to 310F are formed on a same substrate, different substrates on a same package substrate, different substrates of a stack of substrates, or different substrates of a stack of dies. In some embodiments, distances between two of inductive devices 310A to 310F that corresponds to one of magnetic coupling 380A to 380G is equal to or less than one half of a wavelength of an electromagnetic wave having the predetermined frequency. In some embodiments, the predetermined frequency of output oscillating signals ranges from 100 MHz to 20 GHz.

Figure 4:
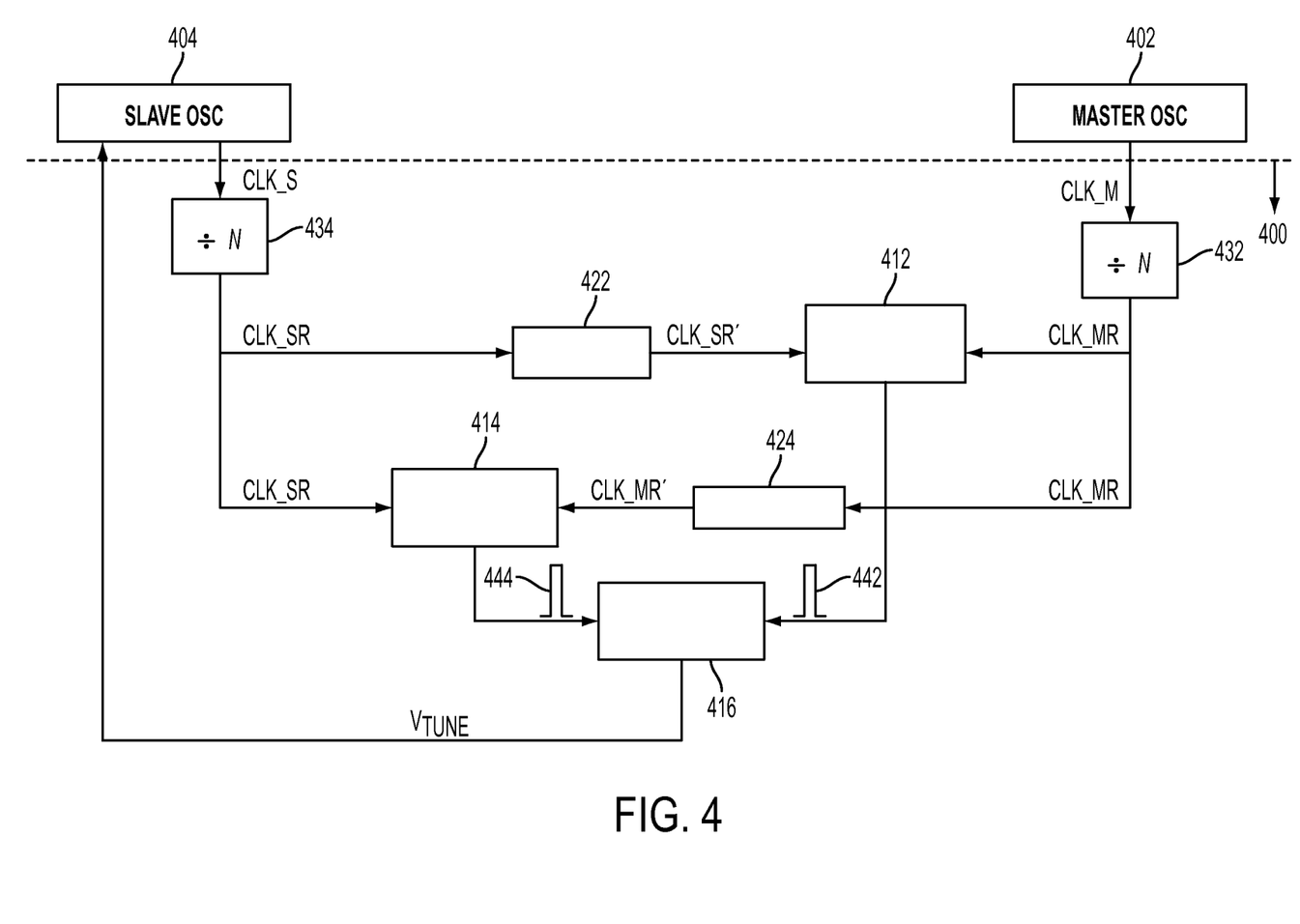
FIG. 4 is a functional block diagram of a set of master-slave fine-tuning unit in accordance with one or more embodiments.

FIG. 4 is a functional block diagram of a set of master-slave fine-tuning unit 400 in accordance with one or more embodiments. The set of master-slave fine-tuning unit 400 is coupled to a mater oscillator 402 and a slave oscillator 404 and is capable of controlling a resonant frequency of slave oscillator 404 based on comparing output oscillating signals of master oscillator 402 and the slave oscillator 404. In some embodiments, master oscillator 402 corresponds to oscillator 100B in FIG. 1, slave oscillator 404 corresponds to oscillator 100A, and resonant frequency of slave oscillator 404 is adjustable by controlling fine-tuning capacitor 124A.

The set of master-slave fine-tuning unit 400 includes a first phase comparator 412, a second phase comparator 414, a control unit 416, a first conductive path 422, a second conductive path 424, a first frequency divider 432, and a second frequency divider 434.

First frequency divider 432 is disposed adjacent to and electrically coupled to master oscillator 402. First frequency divider 432 is configured to receive an output oscillating signal CLK_M from master oscillator 402 and to generate a reference signal CLK_MR by frequency-dividing the output oscillating signal CLK_M by a predetermined ratio N. In some embodiments, N is a positive integer. In some embodiments, N ranges from 4 to 16. Second frequency divider 434 is disposed adjacent to and electrically coupled to slave oscillator 402. Second frequency divider 434 is configured to receive an output oscillating signal CLK_S from slave oscillator 404 and to generate a reference signal CLK_SR by frequency-dividing the output oscillating signal CLK_S by the predetermined ratio N.

In some embodiments, first frequency divider 432 and second frequency divider 434 are omitted, and oscillating signals CLK_M and CLK_S are used as reference signal CLK_MR and reference signal CLK_SR.

First phase comparator 412 is disposed adjacent to the master oscillator 402. Second phase comparator 414 is disposed adjacent to the slave oscillator 404. First conductive path 422 and second conductive path 424 are disposed between master oscillator 402 and slave oscillator 404. First phase comparator 412 is configured to generate a first phase error signal 442 according to reference signal CLK_MR from master oscillator 402 and a delayed version CLK_SR' of reference signal CLK_SR from the slave oscillator 404 transmitted through first conductive path 422. Second phase comparator 414 is configured to generate a second phase error signal 444 according to reference signal CLK_SR from slave oscillator 404 and a delayed version CLK_MR' of reference signal CLK_MR from the master oscillator 402 transmitted through the second conductive path 424.

Control unit 416 is configured to generate a tuning signal $V_{TUNE}$ to slave oscillator 404 according to first phase error signal 442 and second phase error signal 444. In some embodiments, tuning signal $V_{TUNE}$ is usable as analog control signal $V_{CAP}$ of FIG. 2B or as analog control signal for adjusting fine-tuning capacitor 124A carried by path 128A of FIG. 1.

Figure 5:
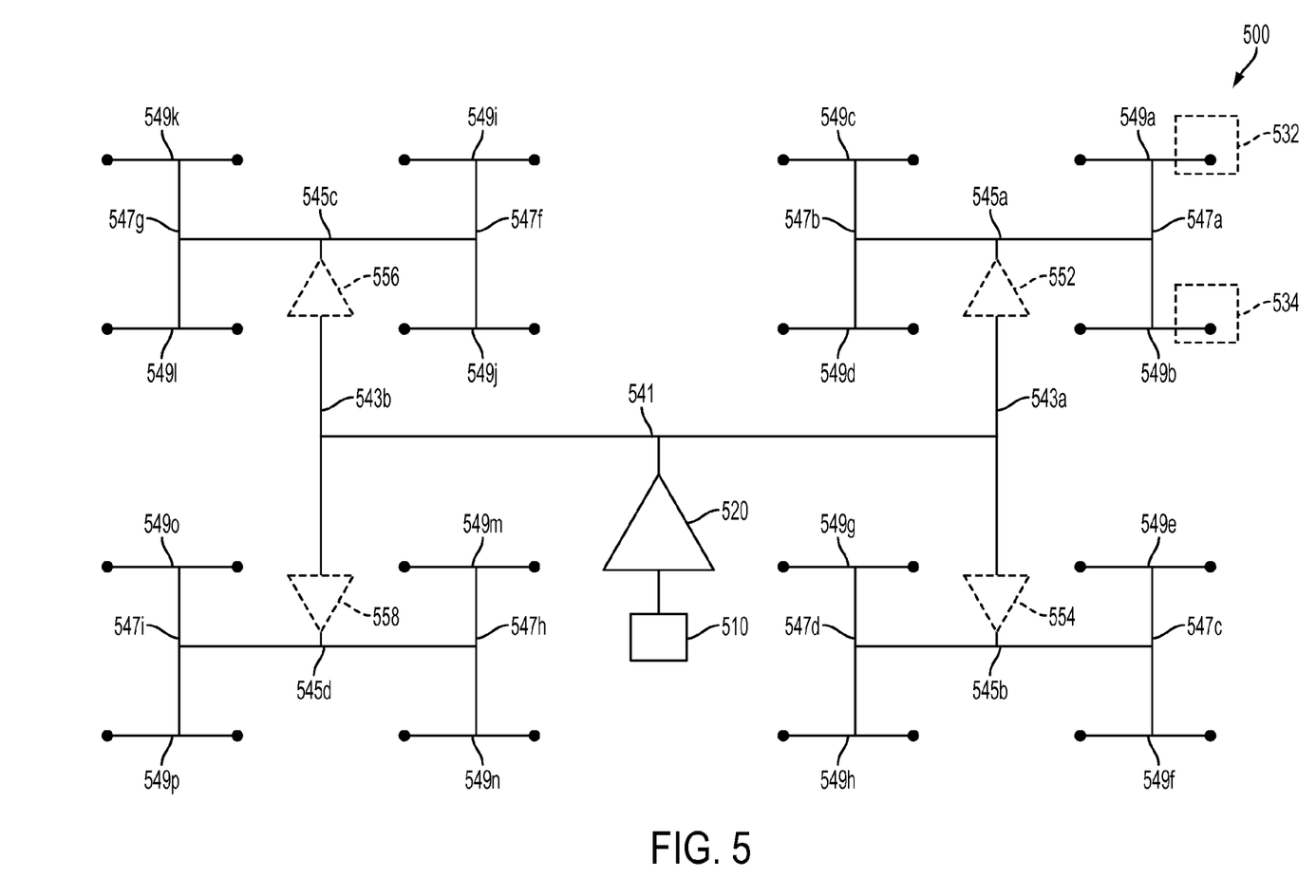
FIG. 5 is a schematic diagram of a pulse distribution network in accordance with one or more embodiments.

FIG. 5 is a schematic diagram of a pulse distribution network 500 in accordance with one or more embodiments. In some embodiments, pulse distribution network 500 is usable to provide a control signal to switch device 140A of oscillator 100A through path 170A and a control signal to switch device 140B of oscillator 100B through path 170B.

Pulse distribution network 500 includes a pulse generator 510, a driver 520, and one or more conductive paths arranged to have an H-tree configuration. Two or more oscillators 532 and 534 are coupled to two of ends of the H-tree. In some embodiments, oscillator 532 corresponds to oscillator 100A in FIG. 1, and oscillator 532 corresponds to oscillator 100B.

Pulse generator 510 is configured to generate a pulse signal usable as control signals for switch devices or reset devices of corresponding oscillators. In some embodiments, the pulse signal has a pulse frequency, and the predetermined frequency of output oscillating signals of oscillators 532 and 534 is an integer multiple of the pulse frequency. The pulse signal is transmitted to oscillators 532 and 534 in order to set output oscillating signals at predetermined voltage levels by corresponding switch devices of the oscillators responsive to the pulse signal. Thus, a timing of rising edges or falling edges of output oscillating signals of oscillators 532 and 534 are synchronized according to the pulse signal.

The H-tree depicted in FIG. 5 is a five-level H-tree including one ($2^0$) first level conductive path 541, two ($2^1$) second level conductive paths 543a and 543b coupled to corresponding ends of path 541, four ($2^3$) third level conductive paths 545a, 545b, 545c, and 545d coupled to corresponding ends of paths 543a or 543b, eight ($2^3$) fourth level conductive paths 547a to 547i coupled to corresponding ends of paths 545a to 545d, and 16 ($2^4$) fifth level conductive paths 549a to 549p coupled to corresponding ends of paths 547a to 547i. Fifth level conductive paths 549a to 549p have ends connected to corresponding switch devices of various oscillators. For example, one end of path 549a is coupled to oscillator 532, and one end of path 549b is coupled to oscillator 534. In some embodiments, each ends of fifth level conductive paths 539a to 539p has a same routing distance. Therefore, conductive paths from driver 520 to corresponding ends of fifth level conductive paths 549a to 549p are configured to impose substantially the same delay to the pulse signal during the transmission and distribution thereof.

Driver 520 is configured to provide sufficient current driving capability to transmit the pulse signal generated by pulse generator 510 to various ends of the fifth level conductive paths 549a to 549p. In some embodiments, additional drivers 552, 554, 556, and 558 are at ends of second level conductive paths 543a and 543b. In some embodiments, additional drivers 552, 554, 556, and 558 are omitted. In some embodiments, additional drivers 552, 554, 556, and 558 are disposed at corresponding ends of a different level of conductive paths in the H-tree.

Therefore, at least three different ways to synchronize output oscillating signals of two or more oscillators, such as oscillators 100A and 100B in FIG. 1, are described above: magnetic coupling (illustrated with reference to FIGS. 1 and 3); master-slave fine-tuning (illustrated with reference to FIG. 4); and pulse injection (illustrated with reference to FIG. 5). In some embodiments, two or more oscillators 100A and 100B are synchronized using magnetic coupling and master-slave fine-tuning mechanisms. In some embodiments, two or more oscillators 100A and 100B are synchronized using magnetic coupling and pulse injection mechanisms. In some embodiments, two or more oscillators 100A and 100B are synchronized using magnetic coupling, master-slave fine-tuning, and pulse injection mechanisms.

Figure 6:
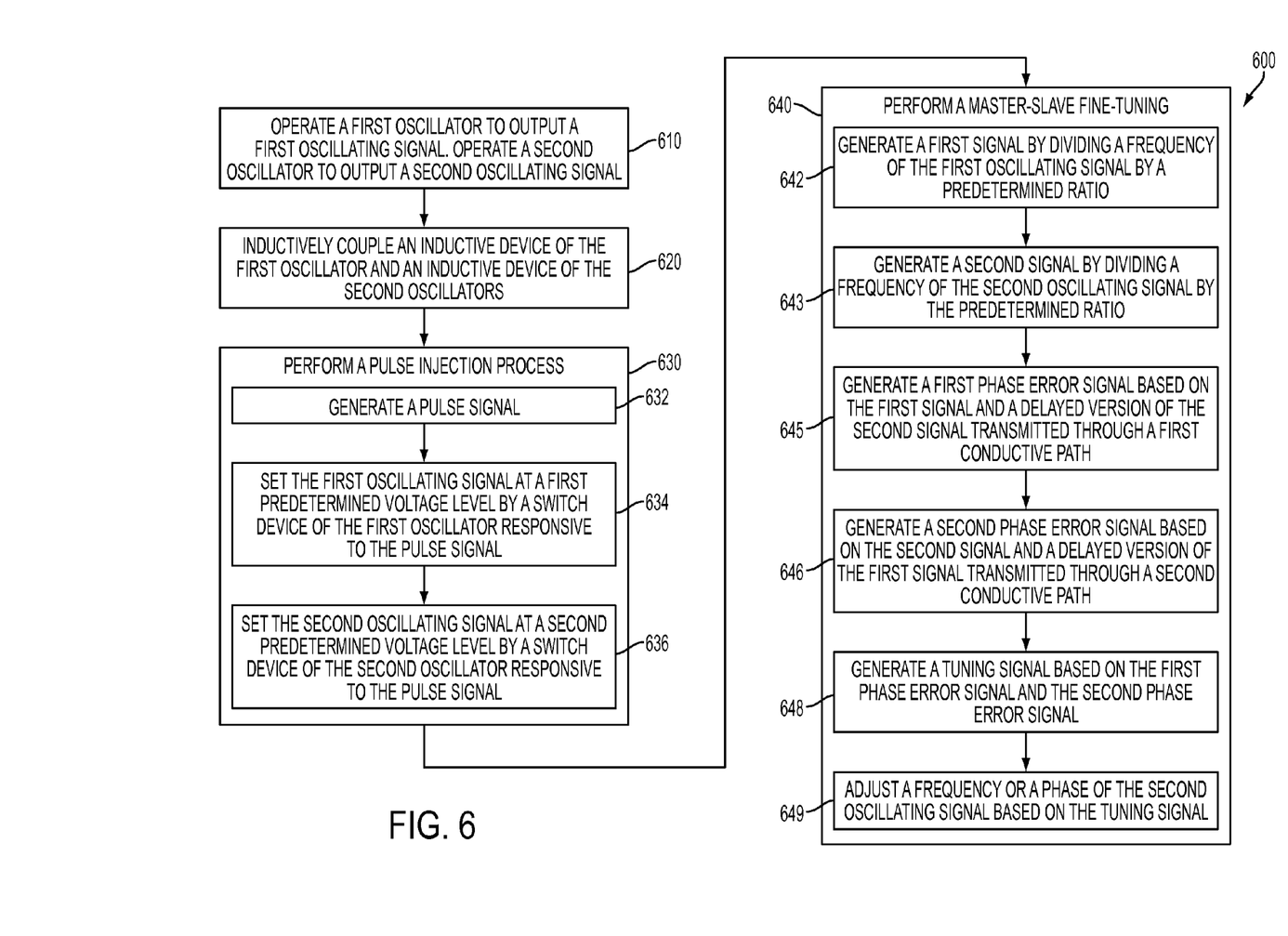
FIG. 6 is a flowchart of a method of synchronizing oscillators in accordance with one or more embodiments.

FIG. 6 is a flowchart of a method 600 of synchronizing oscillators, such as oscillators 100A and 100B depicted in FIG. 1, in accordance with one or more embodiments. It is understood that additional operations may be performed before, during, and/or after the method 600 depicted in FIG. 6, and that some other processes may only be briefly described herein.

In operation 610, oscillators are operated to output oscillating signals. For example, in some embodiments, oscillator 100A is operated to output a first oscillating signal at node 152A, and oscillator 100B is operated to output a second oscillating signal at node 152B.

In operation 620, inductive devices of oscillators are magnetically coupled. For example, in some embodiments, inductive device 110A of oscillator 100A and inductive device 110B of oscillator 100B are magnetically coupled in order to reduce a frequency difference or phase difference between output oscillating signals of oscillator 100A and oscillator 100B.

In operation 630, a pulse injection process is performed on various oscillators. For example, in some embodiments, a pulse injection process is performed on oscillator 100A and oscillator 100B. In some embodiments, operation 630 includes generating a pulse signal (operation 632), transmitting the pulse signal to switch device 140A of oscillator 100A through a first conductive path, and transmitting the pulse signal to switch device 140B of oscillator 100B through a second conductive path. In some embodiments, the first conductive path and the second conductive path are configured to impose substantially a same delay to the pulse signal.

In some embodiments, operation 630 further includes setting the first oscillating signal of oscillator 100A at a first predetermined voltage level by switch device 140A responsive to the pulse signal (operation 634), and setting the second oscillating signal of oscillator 100B at a second predetermined voltage level by switch device 140B responsive to the pulse signal (operation 636).

The method proceeds to operation 640, where a master-slave fine-tuning process is performed on two or more oscillators. For example, in some embodiments, a master-slave fine-tuning process is performed on oscillator 100A and oscillator 100B. As depicted in FIGS. 6 and 4, operation 640 includes generating reference signal CLK_MR by frequency-dividing oscillating signal from oscillator 402 or 100B by a predetermined ratio (operation 642); and generating reference signal CLK_SR by frequency-dividing oscillating signal from oscillator 404 or 100A by the predetermined ratio (operation 643).

Furthermore, in operation 645, a first phase error signal 442 is generated based on reference signal CLK_MR and delayed version CLK_SR' of reference signal CLK_SR transmitted through conductive path 422. In operation 646, a second phase error signal 444 is generated based on reference signal CLK_SR and a delayed version CLK_MR' of reference signal CLK_MR transmitted through conductive path 424. In operation 648, a tuning signal $V_{TUNE}$ is generated based on the first phase error signal 422 and the second phase error signal 424.

As depicted in FIGS. 6 and 1, in operation 649, a frequency or a phase of oscillating signal generated by oscillator 404 or 100A is adjusted based on the tuning signal $V_{TUNE}$.

In some embodiments when synchronizing oscillators 100A and 100B of FIG. 1, either or both of operation 630 or operation 640 is/are omitted.

Moreover, the pulse distribution network 500 in FIG. 5 and pulse-injection process (operation 630) are applicable to other type of oscillators and not limited to LC tank oscillators. In some embodiments, pulse-injection process or pulse-injection mechanism described above is also applicable to a particular type of oscillator known as ring oscillators.

Figure 7:
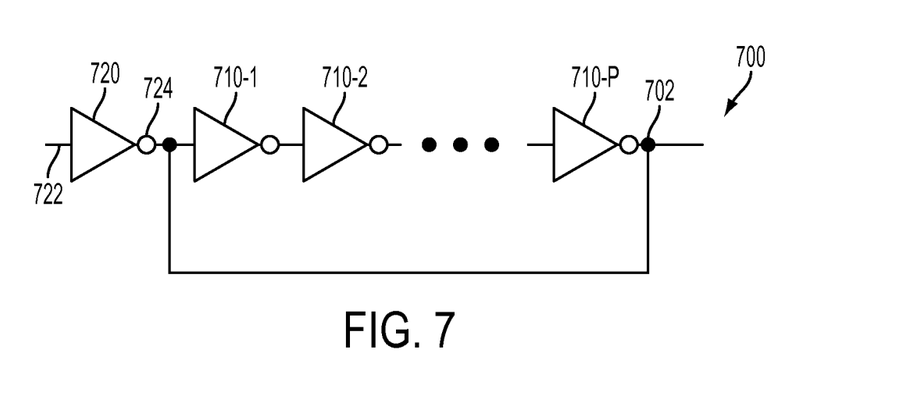
FIG. 7 is a schematic diagram of a ring oscillator in accordance with one or more embodiments.

For example, FIG. 7 is a schematic diagram of a ring oscillator 700 in accordance with one or more embodiments. Oscillator 700 has an output node 702 and P inverters 710-1 to 710-P, where P is an odd integer. Inverters 710-1 to 710-P are connected in series. Furthermore, output terminal of the last stage inverter 710-P is coupled with output node 702, and input terminal of the first stage inverter 710-1 is coupled with output terminal of inverter 710-P. Inverters 710-1 to 710-P are configured to be an active feedback device and to generate an oscillating signal at output node 702. Another inverter 720 has an input terminal configured to receive a pulse signal and an output terminal coupled with first node 702. Inverter 720 functions as a reset device configured to set output oscillating signal at node 704 at a predetermined voltage level responsive to the pulse signal. In some embodiments, two or more ring oscillators similar to oscillator 700 (e.g., oscillators 532 and 534 in FIG. 5) are connected to various ends of a pulse distribution network similar to pulse distribution network 500 in order to synchronizing output oscillating signals of the two or more ring oscillators.

Figure 8:
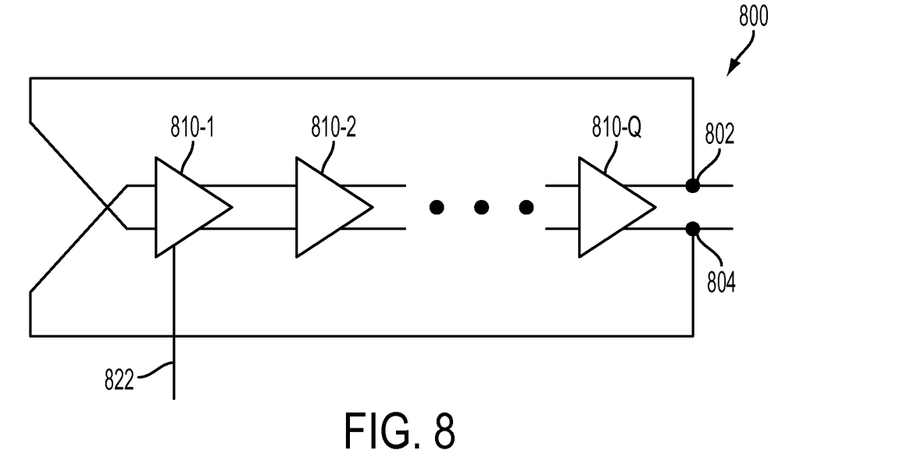
FIG. 8 is a schematic diagram of another ring oscillator in accordance with one or more embodiments.

FIG. 8 is a schematic diagram of another ring oscillator 800 in accordance with one or more embodiments. Oscillator 800 has a pair of output nodes 802 and 804 and Q differential amplifiers 810-1 to 810-Q, where Q is an odd integer. Amplifiers 810-1 to 810-Q are connected in series. Output terminals of the last stage amplifier 810-Q are coupled with output nodes 802 and 804, and input terminals of the first stage amplifier 810-1 are coupled with output terminals of amplifier 810-Q. Amplifiers 810-1 to 810-Q are configured as an active feedback device and to generate a pair of differential oscillating signals at output nodes 802 and 804. One of the amplifiers, such as amplifier 810-1, further includes a switch device or a reset device configured to set output terminals of that amplifier 810-1 at a predetermined voltage level responsive to a pulse signal. In some embodiments, any differential amplifier among amplifiers 810-1 to 810-Q is usable for pulse signal injection. In some embodiments, two or more ring oscillators similar to oscillator 800 (e.g., oscillators 532 and 534 in FIG. 5) are connected to various ends of a pulse distribution network similar to pulse distribution network 500 in order to synchronizing output oscillating signals of the two or more ring oscillators.

In accordance with one embodiment, a circuit includes a first oscillator and a second oscillator. The first oscillator includes an inductive device, a capacitive device, and an active feedback device configured to output a first output signal having a predetermined frequency according to electrical characteristics of the inductive device of the first oscillator and electrical characteristics of the capacitive device of the first oscillator. The second oscillator includes an inductive device, a capacitive device, and an active feedback device configured to output a second output signal having the predetermined frequency according to electrical characteristics of the inductive device of the second oscillator and electrical characteristics of the capacitive device of the second oscillator. The inductive device of the first oscillator and the inductive device of the second oscillator are magnetic coupled.

In accordance with another embodiment, a circuit includes a pulse generator configured to generate a pulse signal, a first oscillator, and a second oscillator. The first oscillator includes an active feedback device configured to output a first output signal having a predetermined frequency and a reset device configured to set the first output signal at a first predetermined voltage level responsive to the pulse signal. The second oscillator includes an active feedback device configured to output a second output signal having the predetermined frequency and a reset device configured to set the second output signal at a second predetermined voltage level responsive to the pulse signal.

In accordance with another embodiment, a method of synchronizing a first oscillator and a second oscillator includes operating the first oscillator to output a first oscillating signal and operating the second oscillator to output a second oscillating signal. An inductive device of the first oscillator and an inductive device of the second oscillators are magnetically coupled.

In accordance with another embodiment, a circuit includes a first oscillator and a second oscillator. The first oscillator includes a first tank circuit, and a first active feedback device coupled to the first tank circuit, the first active feedback device being configured to output a first output signal having a predetermined frequency according to electrical characteristics of the first tank circuit. The second oscillator includes a second tank circuit, the first tank circuit and the second tank circuit being magnetically coupled, and a second active feedback device coupled to the second tank circuit, the second active feedback device being configured to output a second output signal having the predetermined frequency according to electrical characteristics of the second tank circuit.

In accordance with another embodiment, a circuit includes a pulse generator configured to generate a pulse signal, the pulse signal having a pulse frequency. The circuit further includes a first oscillator and a second oscillator. The first oscillator includes a first pair of cross-coupled transistors configured to output a first output signal having a predetermined frequency, the predetermined frequency being an integer multiple of the pulse frequency, and a first pulse injection device configured to set the first output signal at a first predetermined voltage level in response to the pulse signal. The second oscillator includes a second pair of cross-coupled transistors configured to output a second output signal having the predetermined frequency, and a second pulse injection device configured to set the second output signal at a second predetermined voltage level in response to the pulse signal.

In accordance with another embodiment, a method of synchronizing a first oscillator and a second oscillator, the method includes outputting a first oscillating signal from the first oscillator. A second oscillating signal is outputted from the second oscillator. A first inductive device of the first oscillator and a second inductive device of the second oscillator are magnetically coupled. A pulse injection process or a master-slave fine-tuning process is performed.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A circuit comprising:
   a first oscillator, the first oscillator comprising:
      a first tank circuit comprising a first inductive device; and
      a first active feedback device coupled to the first tank circuit, the first active feedback device being configured to output a first output signal having a predetermined frequency according to electrical characteristics of the first tank circuit; and
a second oscillator, the second oscillator comprising:
a second tank circuit comprising a second inductive device, the first tank circuit and the second tank circuit being magnetically coupled; and
a second active feedback device coupled to the second tank circuit, the second active feedback device being configured to output a second output signal having the predetermined frequency according to electrical characteristics of the second tank circuit;
wherein the first inductive device and the second inductive device are separated by a distance equal to or less than a predetermined distance, the predetermined distance being one half of a wavelength of an electromagnetic wave having the predetermined frequency.

2. The circuit of claim 1, wherein the first inductive device is coupled between a first output node and a first complementary output node, wherein the first tank circuit further comprises:
a first capacitive device coupled between the first output node and the first complementary output node; and
a first switch device coupled between the first output node and the first complementary output node, the first output node and the first complementary output node being configured to output the first output signal.

3. The circuit of claim 2, wherein the second inductive device is coupled between a second output node and a second complementary output node, wherein the second tank circuit further comprises:
a second capacitive device coupled between the second output node and the second complementary output node; and
a second switch device coupled between the second output node and the second complementary output node, the second output node and the second complementary output node being configured to output the second output signal.

4. The circuit of claim 3, further comprising a master-slave fine tuning unit, the master-slave fine tuning unit comprising:
a first frequency divider coupled to the first oscillator, the first frequency divider being configured to receive the first output signal and generate a first reference signal by frequency-dividing the first output signal by a predetermined ratio;
a second frequency divider coupled to the second oscillator, the second frequency divider being configured to receive the second output signal and generate a second reference signal by frequency-dividing the second output signal by the predetermined ratio;
a first delay path coupled between the first frequency divider and the second frequency divider, the first delay path being configured to delay the second reference signal and generate a delayed second reference signal;
a second delay path coupled between the first frequency divider and the second frequency divider, the second delay path being configured to delay the first reference signal and generate a delayed first reference signal;
a first phase comparator coupled between the first frequency divider and the first delay path, the first phase comparator being configured to generate a first phase error signal according to the first reference signal and the delayed second reference signal;
a second phase comparator coupled between the second frequency divider and the second delay path, the second phase comparator being configured to generate a second phase error signal according to the delayed first reference signal and the second reference signal; and
a control unit coupled to the first phase comparator, the second phase comparator and the second oscillator, the control unit being configured to generate a tuning signal according to the first phase error signal and the second phase error signal.

5. The circuit of claim 4, wherein the second capacitive device comprises a voltage controlled capacitor, the tuning signal being applied to the voltage controlled capacitor.

6. The circuit of claim 3, wherein the first inductive device and the second inductive device are formed on different substrates on a same package substrate, different substrates of a stack of substrates, or different substrates of a stack of dies.

7. The circuit of claim 3, further comprising a pulse distribution network, the pulse distribution network comprising:
a pulse generator configured to generate a pulse signal, the pulse signal having a pulse frequency, the predetermined frequency being an integer multiple of the pulse frequency; and
one or more conductive paths coupled between the pulse generator and the first oscillator, and between the pulse generator and the second oscillator.

8. The circuit of claim 7, wherein the one or more conductive paths are arranged to have an H-tree configuration.

9. The circuit of claim 7, wherein the first switch device and the second switch device are controlled by the pulse signal.

10. A circuit comprising:
a pulse generator configured to generate a pulse signal, the pulse signal having a pulse frequency;
a first oscillator, the first oscillator comprising:
a first pair of cross-coupled transistors configured to output a first output signal having a predetermined frequency, the predetermined frequency being an integer multiple of the pulse frequency; and
a first switch device configured to set the first output signal at a first predetermined voltage level in response to the pulse signal; and
a second oscillator, the second oscillator comprising:
a second pair of cross-coupled transistors configured to output a second output signal having the predetermined frequency; and
a second switch device configured to set the second output signal at a second predetermined voltage level in response to the pulse signal, wherein the first switch device and the second switch device are controlled by the pulse signal.

11. The circuit of claim 10, wherein a first conductive path configured to carry the pulse signal between the pulse generator and the first oscillator and a second conductive path configured to carry the pulse signal between the pulse generator and the second oscillator are configured to impose substantially a same delay to the pulse signal.

12. The circuit of claim 10, wherein the first oscillator further comprises:
a first inductive device;
a first coarse-tuning capacitive device; and
a first fine-tuning capacitive device.

13. The circuit of claim 12, wherein the second oscillator further comprises:
a second inductive device;
a second coarse-tuning capacitive device; and
a second fine-tuning capacitive device.

14. The circuit of claim 10, further comprising a master-slave fine-tuning unit, the master-slave fine-tuning unit comprising a control unit coupled to the first oscillator and the second oscillator, the control unit being configured to generate a tuning signal according to a first error signal and a second error signal which are calculated using the first output signal and the second output signal, wherein a control terminal of an adjustable capacitive device of the second oscillator is coupled to the tuning signal.

15. A method of synchronizing a first oscillator and a second oscillator, the method comprising:
outputting a first oscillating signal from the first oscillator;
outputting a second oscillating signal from the second oscillator;
magnetically coupling a first inductive device of the first oscillator and a second inductive device of the second oscillator; and
preforming a pulse injection process or a master-slave fine-tuning process, wherein preforming the pulse injection process comprises:
generating a pulse signal;
receiving the pulse signal by a first switch device of the first oscillator through a first conductive path;
setting the first oscillating signal at a first predetermined voltage level by the first switch device in response to the pulse signal;
receiving the pulse signal by a second switch device of the second oscillator through a second conductive path, the first conductive path and the second conductive path being configured to impose substantially a same delay to the pulse signal; and
setting the second oscillating signal at a second predetermined voltage level by the second switch device in response to the pulse signal.

16. The method of claim 15, wherein preforming the master-slave fine-tuning process comprises:
generating a first phase error signal based on a first signal from the first oscillator and a second signal from the second oscillator transmitted through a first delay path;
generating a second phase error signal based on the second signal from the second oscillator and the first signal from the first oscillator transmitted through a second delay path;
generating a tuning signal based on the first phase error signal and the second phase error signal; and
adjusting a frequency or a phase of the second oscillating signal based on the tuning signal.

17. The method of claim 16, wherein preforming the master-slave fine-tuning process further comprises:
generating the first signal by frequency-dividing the first oscillating signal by a predetermined ratio; and
generating the second signal by frequency-dividing the second oscillating signal by the predetermined ratio.

18. The circuit of claim 10, further comprising:
a first conductive path between the pulse generator and the first oscillator; and
a second conductive path between the pulse generator and the second oscillator.

19. The circuit of claim 18, wherein the first conductive path and the second conductive path are configured to impose substantially a same delay to the pulse signal.

20. The circuit of claim 14, wherein the master-slave fine-turning unit further comprises:
a first frequency divider configured to generate a first reference signal by frequency-dividing the first output signal by a pre-determined factor;
a second frequency divider configured to generate a second reference signal by frequency-dividing the second output signal by the pre-determined factor;
a first phase comparator configured to generate the first error signal using the first reference signal and a delayed version of the second reference signal; and
a second phase comparator configured to generate the second error signal using the second reference signal and a delayed version of the first reference signal.

* * * * *